United States Patent [19]

Negahban-Hagh

[11] Patent Number: 4,763,088
[45] Date of Patent: Aug. 9, 1988

[54] SWITCHING SCHEME FOR SWITCHED CAPACITOR FILTERS

[75] Inventor: Mehrdad Negahban-Hagh, Irvine, Calif.

[73] Assignee: Silicon Systems, Inc., Tustin, Calif.

[21] Appl. No.: 857,926

[22] Filed: Apr. 30, 1986

[51] Int. Cl.[4] ...................... H03H 19/00; G11C 27/02
[52] U.S. Cl. .................................. 333/173; 307/353; 307/523; 328/151; 330/9; 330/109
[58] Field of Search .............. 333/166, 167, 172, 173, 333/165; 364/724, 825; 328/151, 167; 307/520–523, 353; 330/9, 107, 109

[56] References Cited

PUBLICATIONS

Gregorian–"Switched–Capacitor Filter Design Using Cascaded Sections", IEEE Trans. on Circuits and Systems, vol. CAS-27, No. 6, Jun. 1980; pp. 515–521.

*Primary Examiner*—Marvin L. Nussbaum
*Attorney, Agent, or Firm*—Blakely, Sokoloff, Taylor & Zafman

[57] ABSTRACT

A filter for second order signals in the frequency domain. A novel switching system is described which permits a single capacitor to serve as both a termination capacitor and a sampling capacitor. A capacitor which has a value equal to the desired value of a sampling capacitor is coupled in a feedback loop of an operational amplifier. This capacitor is summed with another capacitor to result in the desired value of the termination capacitor. The present invention permits the fabrication of second order filters in a smaller silicon area than prior art methods.

6 Claims, 2 Drawing Sheets

SWITCHING SCHEME FOR SWITCHED CAPACITOR FILTERS

BACKGROUND OF THE INVENTION

1. Field of the Invention

This invention relates to the field of switching scheme for switched capacitor filters. In particular, the present invention can be applied to active switched capacitor bi-quad and/or leap frog filters.

2. Background Art

A filter is a circuit network that selectively passes certain ranges of frequencies. Typically, filters come in two types. Passive filters, which employ resistors and capacitors, and active filters, which employ active elements such as operational amplifiers. Filters are applied as low or high pass filters, to attenuate frequencies below or above a certain frequency. Additionally, a filter may act as a band pass filter, allowing passage of frequencies between two limits and attenuating frequencies outside these limits, or as a band split filter, passing frequencies outside two limits and attenuating frequencies within two limits.

One application of active filters is to solve integrodifferential equations such as arise from the use of sinusoidal forcing functions. Such an application utilizes filters, comprising operational amplifiers and switched capacitor networks, as integraters to find solutions for signals which can be described by first order differential equations. Such filters are known as first order filters. When the forcing function or input signal becomes more complex, second order filters are utilized. A second order filter filters signals that can be characterized by a linear differential equation including a second order derivative or by two simultaneous linear first order differential equations. The second order signals can be described by Laplace transforms and are resident in the frequency domain.

One particular type of second order filter is known as a bi-quad (for bi-quadratic) filter. A typical prior art switched capacitor (SC) bi-quad circuit includes two operational amplifiers. Each of these operational amplifiers act as first order filter poles so that the bi-quad circuit can be used to filter second order signals described by simultaneous first order differential equations. Associated with each operational amplifier are capacitors coupled through switches to a feedback loop. An example of such a prior art bi-quad filter is illustrated in FIG. 1 and is discussed in detail below. The ratios of the capacitors associated with the operational amplifiers determine the frequency response of the SC bi-quad circuit.

The SC bi-quad circuit, such as the one described above, is often used as a component in semiconductor chips. In the manufacture of semiconductor chips, it is desired to minimize the silicon area used in making the chip to maximize yield and reduce the cost per chip. Switched capacitors require relatively large amounts of silicon die area to fabricate. Therefore, if the area required for switched capacitors in a bi-quad filter could be reduced, the filter could be produced in a smaller area, leading to more efficient chip production.

Therefore, it is an object of the present invention to provide a method of switching to be used in filters for second order signals, which requires less silicon area than prior art filters. In particular, the present invention is directed toward a bi-quad filter using less silicon area than prior art bi-quad filters.

SUMMARY OF THE PRESENT INVENTION

A filter for second order signals in the Laplace frequency domain. A novel switching system is described which permits a single capacitor to serve as both termination capacitor and a sampling capacitor. A capacitor which has a value equal to the desired value of a sampling capacitor is coupled in a feedback loop of an operational amplifier. This capacitor is summed with another capacitor to result in the desired value of the terminating capacitor. The present invention permits the fabrication of second order filters in a smaller silicon area than prior art methods.

DETAILED DESCRIPTION OF THE PRESENT INVENTION

A novel switching system for use in second order SC filters is described. In the following description, numerous specific details are set forth, such as capacitor ratios, etc. in order to provide a more thorough understanding of the present invention. It will be obvious, however, to one skilled in the art, that the present invention may be practiced without these specific details. In other instances, well known circuits have not been shown in detail in order not to unnecessarily obscure the present invention.

PRIOR ART

Figure 1:
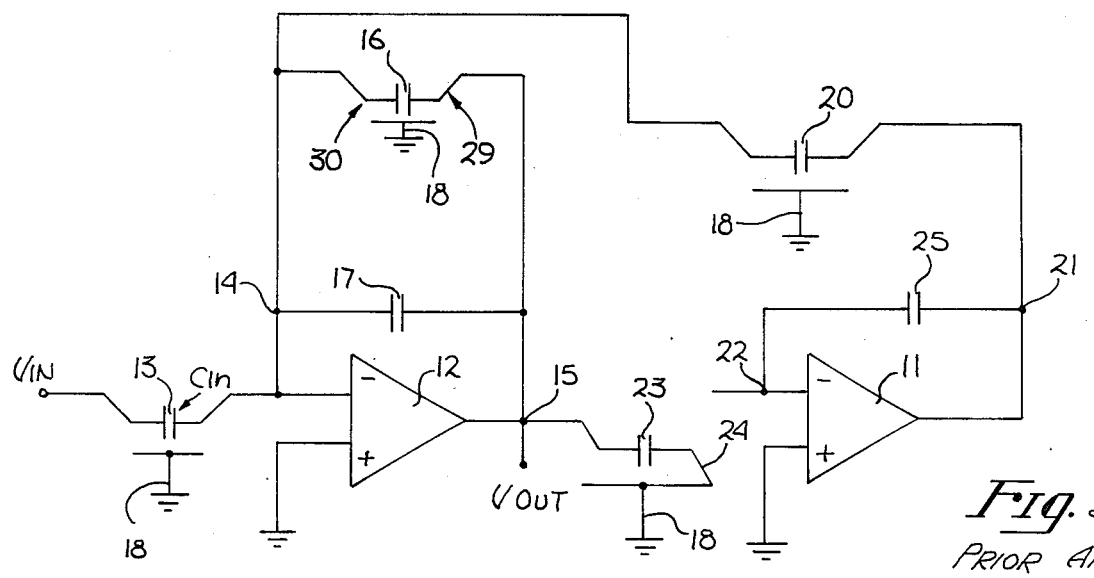
FIG. 1 is an electrical schematic illustrating a prior art bi-quad filter.

An example of a prior art SC bi-quad filter is illustrated in FIG. 1. The filter consists of a pair of operational amplifiers 11 and 12. Associated with the operational amplifiers are a series of switched capacitors coupled between the inverting input and the output of each amplifier. The circuit of FIG. 1 integrates second order polynomials.

The noninverting inputs of operational amplifiers 11 and 12 are coupled to ground 18. The input signal, Vin, is coupled to node 14 through switched capacitor Cin 13. Cin 13 is a gain capacitor which provides a gain factor to the input signal. One terminal of capacitor Cin 13 is switched between Vin and ground 18 while the other terminal of capacitor Cin 13 is switched between node 14 and ground 18. The inverting input of operational amplifier 12 is coupled to node 14.

A pair of capacitors 16 and 17 are coupled in parallel between node 14 and the output of operational amplifier 12. Capacitor 16 is a switched capacitors with one terminal switching between ground 18 and node 14 and the other terminal switching between ground 18 and node 15 (the output of operational amplifier 12). Switched capacitor 16 acts as a termination capacitor (CT).

Switched capacitor 20 is coupled between node 21 of operational amplifier 11 and node 14 of operational amplifier 12. One terminal of capcitor 20 is switched between node 21 and ground 18 while the other terminal is switched between node 14 and ground 18. Capacitor 20 is a sampling capacitor.

Capacitor 17 is coupled between node 14 and node 15. The output of operational amplifier 12 is equal to the integral of Vin over time. This value is proportional to the charge on capacitors 16 and 20. Capacitor 17 is a feedback capacitor. The ratio of switched capacitors 16 and 20 with capacitor 17 controls the sharpness, quality and frequency response of the SC bi-quad circuit.

A second integration is performed on the input signal by passing it through operational amplifier 11. The output of operational amplifier 12 at node 15 is coupled to switched capacitor 23. Capacitor 23 is a sampling capacitor. One terminal of switched capacitor 23 is switched between node 15 and ground 18 while the other terminal is switched between node 22 (the inverting input of operational amplifier 11) and ground 18. The output of operational amplifier 11, node 21, is coupled through capacitor 25 to node 22. Capacitor 25 is a feedback capacitor and, like capacitor 17, the ratio of switched capacitor 23 and capacitor 25 controls the frequency response of the SC bi-quad circuit.

The circuit of FIG. 1 is suitable for filtering second order bi-quad signals.

PRESENT INVENTION

Figure 2:
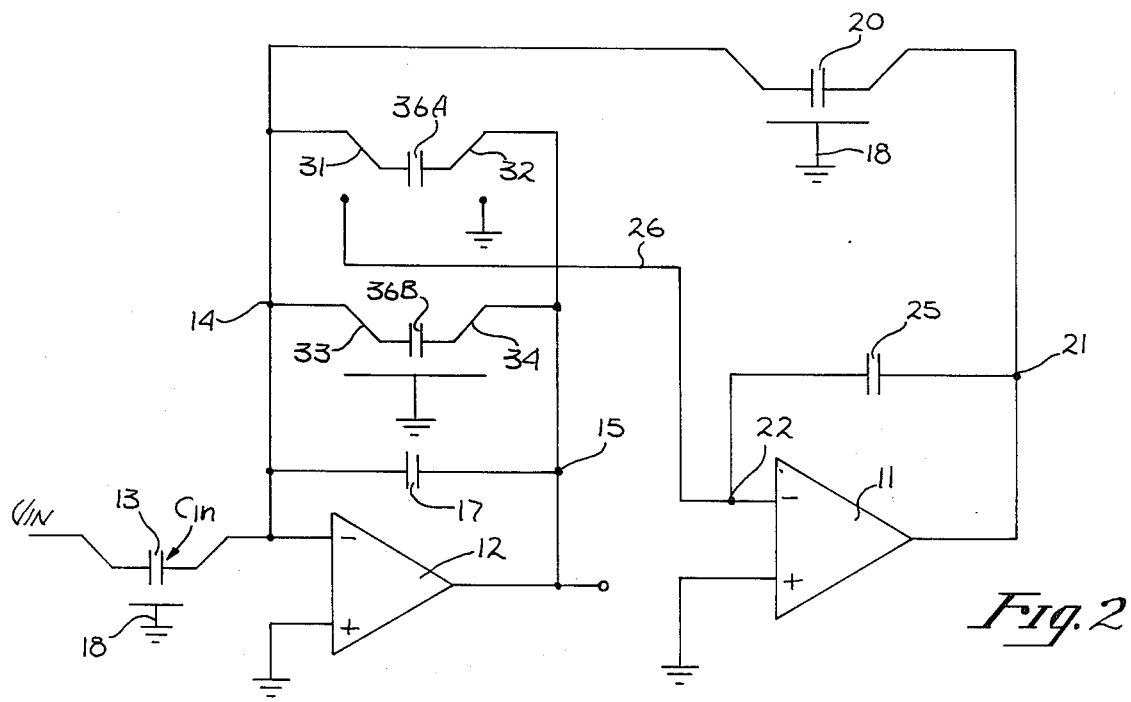
FIG. 2 is an electrical schematic illustrating the preferred embodiment of the present invention.

The preferred embodiment of the present invention is illustrated in FIG. 2. The present invention utilizes a novel switching system which allows a single capacitor to have double duty as a termination capacitor and sampling capacitor.

Referring to FIG. 2, capacitor 16 of FIG. 1 has been replaced by capacitors 36A and 36B of FIG. 2. Capacitor 36B is a switched capacitor with one terminal being switched between ground 18 and node 14, and the other terminal being switched from node 15 to ground 18.

Capacitor 36A is also a switched capacitor. One terminal of capacitor 36A is switched between node 15 and ground 18. The other terminal of capacitor 36A is switched between node 14, associated with operational amplifier 12, and line 26, coupled to node 22, the inverting input of operational amplifier 11. The purpose of capacitors 36A and 36B is to replace termination capacitor 16 and sampling capacitor 23 of FIG. 1. By utilizing the embodiment shown in FIG. 2, the silicon area required to fabricate capacitors 36A and 36B can be limited to the greater of the areas of capacitor 16 or capacitor 23 of FIG. 1. In semiconductor processing, the capacitive value of a capacitor is directly related to the area of fabrication, the greater the area, the larger the capacitance.

In the present invention of FIG. 2 the sum of capacitors 36A and 36B is equivalent to the capacitance of capacitor 16 while capacitor 36A is equivalent to capacitor 23. Capacitor 36A serves double duty as capacitor 23 and as a portion of capacitor 16. The total area required for capacitors 36A and 36B is the area required for capacitor 16. The area required for capacitor 23 is not required in the scheme of FIG. 2.

By way of example, if the capacitance of capacitor 16 of FIG. 1 is such that it requires 5 units of silicon area of fabrication and capacitor 23 is such that its fabrication requires 3 units of silicon area, a total of 8 units of silicon area is required. However, in the present invention as shown in FIG. 2, capacitor 36A is equivalent to capacitor 23 of FIG. 1 and thus requires 3 units of silicon area. Capacitors 36A and 36B combined are equivalent to capacitor 16 of FIG. 1 and thus requires a total of 5 units of area. Therefore, capacitor 36B requires 2 units of area. As a result, the present invention provides a termination capacitor and a sampling capacitor in 5 units of area where a prior art design requires 8 units of area.

There are three possible relationships between the termination capacitance (CT) and the sampling capacitance (CS). CT may be greater than, equal to, or less than CS. The nature of the relationship between CT and CS will determine the switch positions and the capacitive values of capacitors 36A, 36B and 17 of FIG. 2. The switched capacitor filter has two time phases, PH1 and PH2, of operation. The following table illustrates the switch positions for capacitor 16, 23, 36A and 36B during these time phases.

|  | PH1 | PH2 |
|---|---|---|
| FIG. 1 (prior art) | | |
| Capacitor 23 | | |
| Switch 24 | Ground 18 | Node 22 |
| Switch 28 | Node 15 | Ground 18 |
| Capacitor 16 | | |
| Switch 29 | Node 15 | Ground 18 |
| Switch 30 | Node 14 | Ground 18 |
| FIG. 2 | | |
| (CT > CS) | | |
| Capacitor 36A | | |
| Switch 31 | Node 14 (virtual ground) | Node 22 |
| Switch 32 | Node 15 | Ground 18 |
| Capacitor 36B | | |
| Switch 33 | Node 14 | Ground 18 |
| Switch 34 | Node 15 | Ground 18 |
| (CT < CS) | | |
| Capacitor 36A | | |
| Switch 31 | Node 14 (virtual ground) | Node 22 |
| Switch 32 | Node 15 | Ground 18 |
| Capacitor 36B | | |
| Switch 33 | Node 14 | Ground 18 |
| Switch 34 | Ground 18 | Node 15 |

CT GREATER THAN CS

When the capacitance of capacitor 16 is to be greater than capacitor 23, (CT greater than CS) the capacitance of capacitor 36A of FIG. 2 is chosen equal to CS. Capacitor 36B is then chosen such that the sum of capacitor 36A and 36B is equal to the CT. FIG. 1 and FIG. 2 are drawn for the phase 1 position. Referring to FIG. 1, we see that CT (capacitor 16) is coupled to node 14 and node 15 during PH1. Referring to FIG. 2 the equivalent of CT (capacitors 36A and 36B) is likewise coupled to nodes 14 and 15.

Referring again to FIG. 1, at PH1 CS (capacitor 23) is coupled to node 15 and to ground 18. Referring to FIG. 2, the equivalent of CS (capacitor 36A), is also coupled to node 15 and to ground. The ground is a virtual ground at node 14. By taking advantage of the virtual ground at node 14, one switched capacitor is eliminated.

In phase 2, CT (capacitor 16) is coupled to ground to allow discharge. CS (Capacitor 23) is coupled at one terminal to ground and at the other terminal to node 22 of operational amplifier 11. Referring to FIG. 2, in phase 2 of the present invention, CT, (capacitors 36A and 36B) is uncoupled from the feedback loop, capacitor 36B is coupled to ground and CS, (Capacitor 36A), is coupled at one terminal to ground and at the other terminal to node 22.

The equivalent capacitance values for the circuits shown in FIGS. 1 and 2 are as follows:

CT FIG. 1 (16) is equal to CT FIG. 2 (36A+36B)
CS FIG. 1 (23) is equal to CS FIG. 2 (36A).

Thus, the circuit shown in FIG. 2 is the equivalent of the circuit shown in FIG. 1 but requires less silicon area.

CT LESS THAN CS

Figure 3:
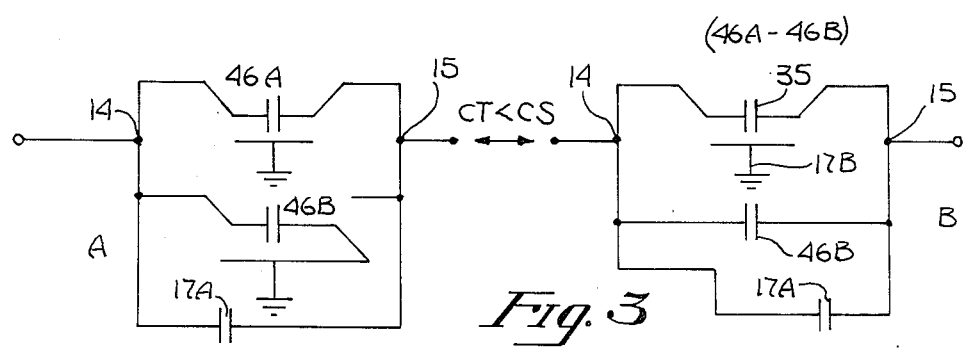
FIG. 3 is an electrical schematic illustrating an equivalent circuit utilized in the present invention.

When the capacitance of CT (16) is to be less than CS, (capacitor 23), the present invention takes advantage of the equivalent circuit illustrated in FIG. 3. FIG. 3A illustrates phase 1. Capacitor 46A is coupled to node 14 and node 15. One terminal of capacitor 46B is coupled to node 14 while the other terminal is coupled to ground 18. Capacitor 17A is coupled to nodes 14 and 15. This configuration is equivalent to the circuit shown in FIG. 3B in which capacitor 35, coupled to nodes 14 and 15 is equivalent to capacitor 46A minus capacitor 46B. In the equivalent circuit, capacitor 46B is coupled to nodes 14 and 15. In this configuration, the value of capacitor 46A is chosen to be equal to CS (capacitor 23). Capacitor 46B is chosen so that the difference between capacitor 46A and capacitor 46B (capacitor 35) is equal to CT. Capacitor 17A of FIG. 3 is chosen so that the sum of capacitor 17A and capacitor 46B is equal to capacitor 17 of FIG. 1.

Figure 4:
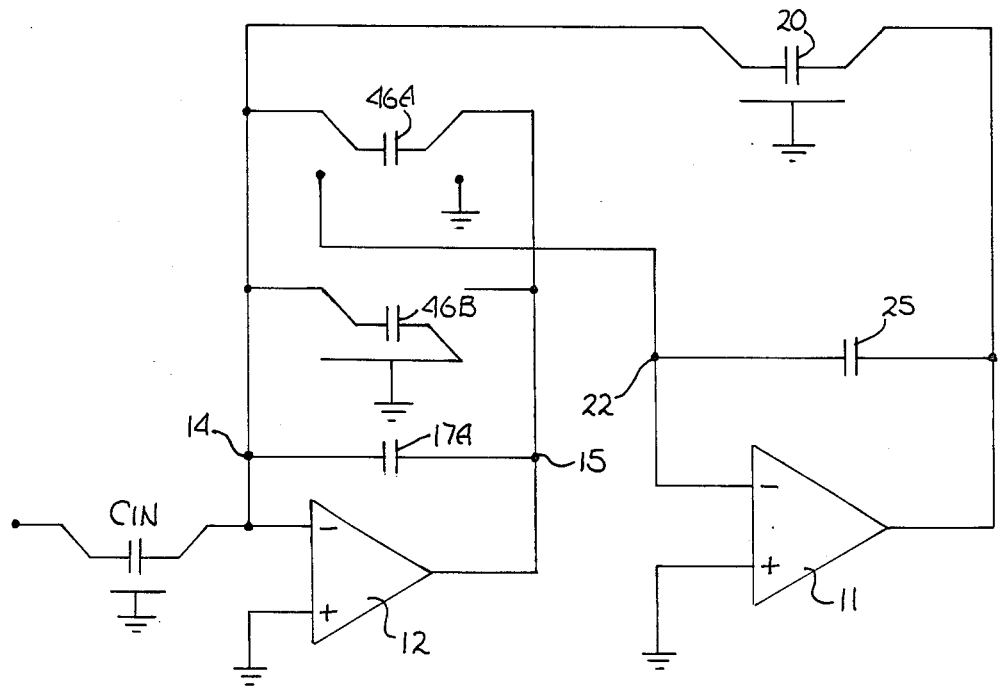
FIG. 4 is an electrical schematic illustrating an alternate embodiment of the present invention.

Thus, during phase 1, CT is coupled to nodes 14 and 15 and CS (capacitor 23) is coupled to node 15 and to ground 18 in FIG. 1. In FIG. 4, the equivalent of CT (capacitor 46A minus capacitor 46B), is coupled to nodes 14 adn 15. The equivalent of CS (capacitor 35), is coupled to node 14 (virtual ground) and to node 15. The equivalent of feedback capacitor 17, (CF) (the sum of capacitor 46B and capacitor 17A), is coupled to nodes 14 and 15.

During phase 2, CT (capacitor 16) is coupled to ground 18, CS (capacitor 23) is coupled to ground at one terminal and to node 22 at the other terminal, and CF (capacitor 17) is coupled to nodes 14 and 15. In phase 2 of the present invention, the equivalent of CT (capacitor 46A minus capacitor 46B or capacitor 35), is coupled to ground. The equivalent of CS (capacitor 46A), is coupled at one terminal to node 22 and at the other terminal to ground 18. The equivalent of CF (the sum of capacitors 46B and capacitor 17A), is coupled to nodes 14 and 15.

Equivalent capacitance values for the circuit shown in FIGS. 1 and 4 when CT is less than CS is as follows:

CT FIG. 1 (16) is equal to CT FIG. 4 (46A minus 46B)
CS FIG. 1 (23) is equal CT FIG. 4 (46A)
CF FIG. 1 (17) is equal to CF FIG. 4 (46B+17A)

CT EQUAL TO CS

When the capacitance of CT (16) is to be equal to CS (capacitor 23) the equivalent capacitance for the circuit shown in FIGS. 1 and 2 is as follows:

CT FIG. 1 (16) is equal to CT FIG. 2 (36A+36B)
CS FIG. 1 (23) is equal to CS FIG. 2 (36A+36B). In this case capacitors 36A and 36B can be one capacitor.

In such a situation, one terminal of capacitor 36B is coupled to node 22 during phase 2 as shown in FIG. 2 for capacitor 36A.

Although the present invention has been described in terms of a bi-quad filter, it has equal application to other types of filters, such as leap frog filters.

Thus, a second order switched capacitor filter has been described which utilizes less silicon area for fabrication than prior art design.

I claim:

1. A second order filter circuit comprising:
a first operational amplifier having a first output node and first and second input nodes;
a second operational amplifier having a second output node and third and fourth input nodes;
a first feedback capacitor coupled to said first amplifier at said first output node and said first input node;
a second feedback capacitor coupled to said second amplifier at said second output node and said third input node;
a first termination capacitor coupled to said first output node and said first input node;
a second termination capacitor coupled to said first output node and said first input node;
one of said first and second termination capacitors acting as a first sampling capacitor;
a second sampling capacitor coupled to said first input node and said second output node;
whereby a second order filter circuit is provided.

2. The circuit of claim 1 wherein said first input node comprises an inverting input of said first amplifier.

3. The circuit of claim 1 wherein said second input node comprises an inverting input of said second amplifier.

4. A second order filter circuit having first and second phases of operation, said circuit comprising:
a first operational amplifier having first and second input nodes and a first output node;
a second operational amplifier having third and fourth input nodes and a second output node;
a first feedback capacitor coupled to said first amplifier at said first input node and said first output node;
a second feedback capacitor coupled to said second amplifier at said second output node and said third output node;
a first termination capacitor switchably coupled to said first input node and said first output node during said first phase, said first termination capacitor switchably coupled to said third input node and to ground during said second phase, said first termination capacitor acting as a first sampling capacitor;
a second termination capacitor coupled to said first input node and said first output node during said first phase, said second termination capacitor coupled to ground during said second phase;
a second sampling capacitor switchably coupled to said first input node and said second output node during said first phase, said second sampling capacitor switchably coupled to ground during said second phase;
whereby a second order filter is provided.

5. The circuit of claim 4 wherein said first input node comprises an inverting input of said first amplifier and said second input node comprises an inverting input of said second amplifier.

6. The circuit of claim 4 wherein said first input node is a virtual ground during said first phase.

* * * * *

UNITED STATES PATENT AND TRADEMARK OFFICE
CERTIFICATE OF CORRECTION

PATENT NO. : 4,763,088
DATED : August 9, 1988
INVENTOR(S) : Mehrdad Negahban-Hagh It is certified that error appears in the above-identified patent and that said Letters Patent is hereby corrected as shown below:

In column 1, line 8, "scheme" should read --schemes--;
    line 28, "integraters" should read --integrators--;
    line 42, "Each" should read --Both--.
In column 2, line 60, "capacitors" should read --capacitor--;
    line 67, "capcitor" should read --capacitor--.
In column 3, line 52, after FIG. 2, insert --,--;
    line 61, "area of" should read --area for--;
    line 68, "requires" should read --require--.
In column 4, line 6, "terination" should read --termination--;
    line 53, after "PH1", insert --,--;
    line 61, "Capacitor" should read --capacitor--;
    line 64, after "CT", delete --,--;
    line 66, "CS, (Capacitor 36A)," should read
    --CS (capacitor 36A)--.
In column 5, line 33, "adn" should read --and--;
    line 52, replace "minus" with a subtraction symbol.

Signed and Sealed this

Tenth Day of August, 1993

Attest:

MICHAEL K. KIRK

Attesting Officer     Acting Commissioner of Patents and Trademarks